United States Patent
Tapily et al.

(10) Patent No.: US 9,558,962 B2
(45) Date of Patent: Jan. 31, 2017

(54) SUBSTRATE PROCESSING METHOD

(71) Applicant: Tokyo Electron Limited, Minato-ku, Tokyo (JP)

(72) Inventors: Kandabara N. Tapily, Albany, NY (US); Fumitaka Amano, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/823,363

(22) Filed: Aug. 11, 2015

(65) Prior Publication Data

US 2016/0049309 A1 Feb. 18, 2016

Related U.S. Application Data

(60) Provisional application No. 62/036,474, filed on Aug. 12, 2014.

(51) Int. Cl.
*H01L 21/311* (2006.01)
*H01L 21/02* (2006.01)
(Continued)

(52) U.S. Cl.
CPC ..... *H01L 21/31116* (2013.01); *H01L 21/0206* (2013.01); *H01L 21/02252* (2013.01);
(Continued)

(58) Field of Classification Search
CPC .................................................. H01L 21/02252
(Continued)

(56) References Cited

U.S. PATENT DOCUMENTS 6,313,042 B1 * 11/2001 Cohen ............... H01L 21/02063
257/E21.226
7,977,244 B2 * 7/2011 Lai .................... H01L 21/02063
134/1.2
(Continued)

OTHER PUBLICATIONS

Korean Intellectual Property Office, International Search Report and Written Opinion for International application No. PCT/US2015/044623, mailed Nov. 20, 2015, 15 pages.
(Continued)

*Primary Examiner* — Dung Le
(74) *Attorney, Agent, or Firm* — Wood Herron & Evans LLP (57) ABSTRACT

A method for passivating a surface of a semiconductor substrate with fluorine-based layer to protect the surface against oxidation and allow longer queue times. According to one embodiment, the method includes providing a substrate having an oxidized layer formed thereon, replacing the oxidized layer with a fluorine-based layer, exposing the fluorine-based layer to an oxidizing atmosphere, where the fluorine-based layer protects the substrate against oxidation by the oxidizing atmosphere, and removing the fluorine-based layer from the substrate using a plasma process. According to another embodiment, the method includes providing a passivated substrate in a vacuum processing tool, the passivated substrate having a fluorine-based layer thereon that is effective for protecting the passivated substrate against oxidation by an oxidizing atmosphere, removing the fluorine-based layer from the passivated substrate using a microwave plasma process in the vacuum processing tool, thereby forming a clean substrate, and processing the clean substrate under vacuum conditions.

21 Claims, 10 Drawing Sheets

(51) Int. Cl.
  *H01L 29/16* (2006.01)
  *H01L 21/28* (2006.01)
  H01L 29/161 (2006.01)
  H01L 29/51 (2006.01)

(52) U.S. Cl.
  CPC .. *H01L 21/02337* (2013.01); *H01L 21/28238* (2013.01); *H01L 21/28255* (2013.01); *H01L 29/16* (2013.01); H01L 29/161 (2013.01); H01L 29/513 (2013.01); H01L 29/517 (2013.01)

(58) Field of Classification Search
  USPC ................................ 438/700, 706, 710, 714
  See application file for complete search history.

(56) References Cited

U.S. PATENT DOCUMENTS

| | | |
|---|---|---|
| 2002/0177309 A1 | 11/2002 | Chen |
| 2003/0234440 A1 | 12/2003 | Liang et al. |
| 2005/0045206 A1* | 3/2005 | Smith ................... B08B 7/0035 134/16 |
| 2009/0286381 A1 | 11/2009 | Van Schravendijk |
| 2011/0168205 A1* | 7/2011 | Tahara .............. H01L 21/67028 134/1.1 |
| 2012/0055401 A1 | 3/2012 | Tozawa |
| 2012/0273861 A1 | 11/2012 | Cheng et al. |
| 2013/0012012 A1 | 1/2013 | Lin et al. |

OTHER PUBLICATIONS

Taiwan Intellectual Property Office, Notification of Examination Opinion issued in corresponding TW Application No. 104126042 dated Aug. 12, 2016, 11 pp., including English translation.

* cited by examiner

SUBSTRATE PROCESSING METHOD

This application claims priority to U.S. Provisional Patent Application No. 62/036,474 filed on Aug. 12, 2014, the contents of which is incorporated herein by reference in its entirety.

FIELD OF THE INVENTION

The present invention generally relates to processing of a substrate in semiconductor manufacturing, and more particularly to a method of passivating a surface of a semiconductor substrate with fluorine-based layer in order to protect the surface against oxidation and allow longer queue times.

BACKGROUND OF THE INVENTION

Devices with a high-mobility channel, such as, SiGe, Ge and III-V semiconductors offer the possibility of increased device performance beyond traditional Si-based devices. In particular, Ge is an attractive candidate due to its lower effective mass and higher mobility for charge carriers compared to Si. One of the major issues with the high mobility channel such as Ge and III-V compound is the poor oxide and interface quality resulting in device performance degradation.

SUMMARY OF THE INVENTION

According to one embodiment, a substrate processing method is provided that includes providing a substrate having an oxidized layer formed thereon, replacing the oxidized layer with a fluorine-based layer, exposing the fluorine-based layer to an oxidizing atmosphere, where the fluorine-based layer protects the substrate against oxidation by the oxidizing atmosphere, and removing the fluorine-based layer from the substrate using a plasma process.

According to another embodiment, the method includes providing a Ge-containing substrate having an oxidized layer containing Ge formed thereon, removing the oxidized layer from the Ge-containing substrate by an exposure to a cleaning gas containing a) $NH_3$ and HF, or b) $NF_3$ and HF, where the exposure to the cleaning gas further passivates the Ge-containing substrate with a fluorine-based layer. The method further includes exposing the fluorine-based layer to an oxidizing atmosphere, where the fluorine-based layer protects the substrate against oxidation by the oxidizing atmosphere. The method further includes removing the fluorine-based layer from the Ge-containing substrate using a microwave plasma process containing $H_2$ gas, forming an oxygen-containing interface layer on the Ge-containing substrate using a microwave plasma process, and depositing a high-k film on the oxygen-containing interface layer, where the Ge-containing substrate is maintained under vacuum conditions from before removing the fluorine-based layer to after depositing the high-k film.

According to another embodiment, the method includes providing a passivated substrate in a vacuum processing tool, the passivated substrate having a fluorine-based layer thereon that is effective for protecting the passivated substrate against oxidation by an oxidizing atmosphere, removing the fluorine-based layer from the passivated substrate using a microwave plasma process in the vacuum processing tool, thereby forming a clean substrate, and processing the clean substrate under vacuum conditions.

DETAILED DESCRIPTION OF SEVERAL EMBODIMENTS

Embodiments of the invention provide a method for passivating a surface of a semiconductor substrate with fluorine-based layer in order to protect the surface against oxidation and allow longer queue times. The waiting time between processes for forming a semiconductor device are generally referred to as a queue time. A dry surface cleaning process is used to passivate the surface of the semiconductor substrate with the fluorine-based layer. The fluorine-based layer may be removed by a plasma process to provide a clean surface for further processing of the substrate. The method allows for improving semiconductor device performance such as interface trap density ($D_{it}$), mobility, and subthreshold swing (SS).

Embodiments of the invention are described below in reference to the Figures. According to one embodiment, a method is provided for processing a substrate. The method includes providing a substrate having an oxidized layer formed thereon, replacing the oxidized layer with a fluorine-based layer, exposing the fluorine-based layer to an oxidizing atmosphere, where the fluorine-based layer protects the substrate against oxidation by the oxidizing atmosphere, and removing the fluorine-based layer from the substrate using a plasma process. In one example, the oxidizing atmosphere can be air. In other examples, the oxidizing atmosphere can include oxygen-containing gases that are frequently found in vacuum processing tools, including $O_2$, $H_2O$, and $CO_2$. Although those oxygen-containing gases are normally found in very low concentration in evacuated vacuum processing systems, exposing a semiconductor substrate to those gases can result in unacceptable oxidation of the substrate in a semiconductor manufacturing process.

According to another embodiment, the method includes providing a passivated substrate in a vacuum processing tool, the passivated substrate having a fluorine-based layer thereon that is effective for protecting the substrate against oxidation by an oxidizing atmosphere, removing the fluorine-based layer from the substrate using a microwave plasma process in the vacuum processing tool, thereby forming a clean substrate, and processing the clean substrate under vacuum conditions.

Figure 1:
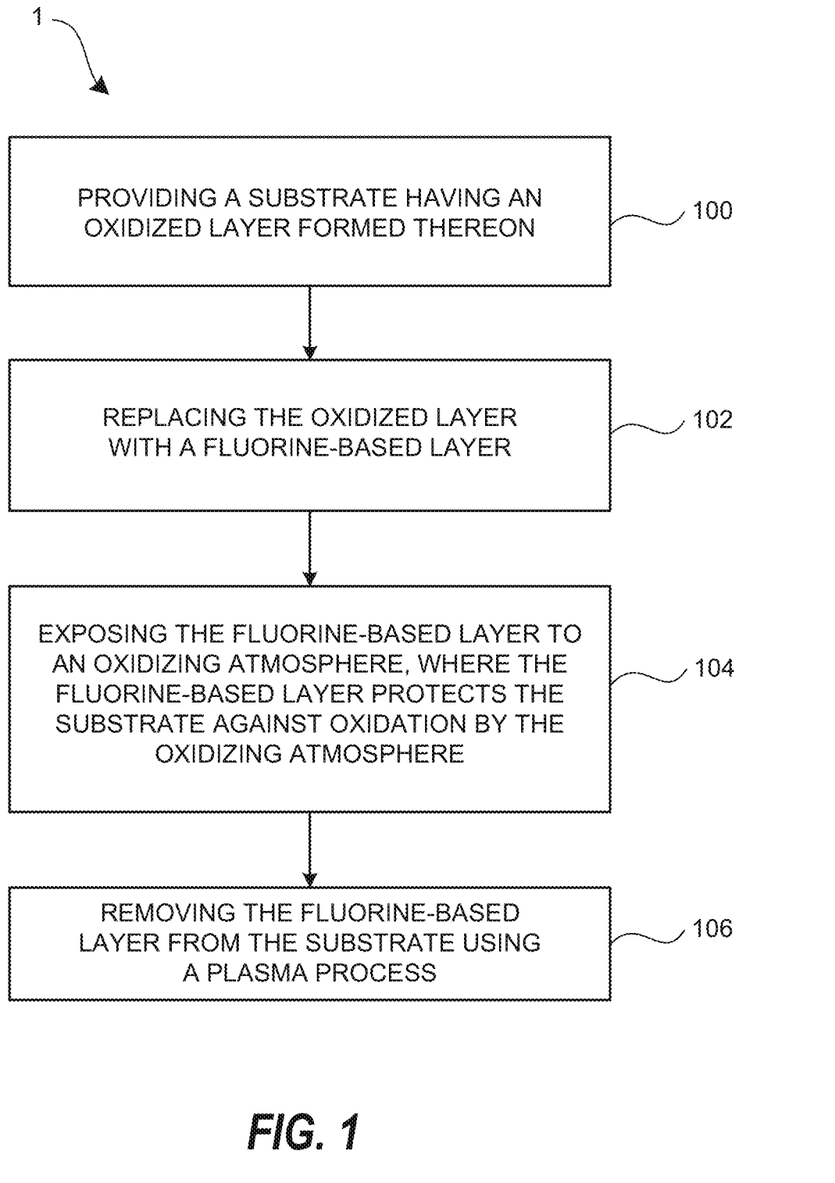
FIG. 1 is a process flow diagram for a method of processing a substrate according to an embodiment of the invention.
Figure 2A:
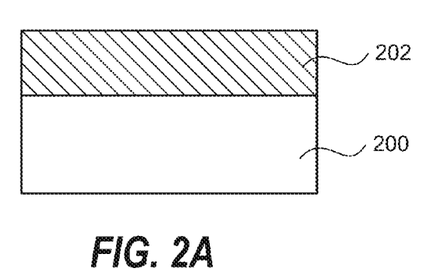
FIGS. 2A-2F schematically show cross-sectional views of a method of processing a substrate according to an embodiment of the invention.

FIG. 1 is a process flow diagram 1 for a method of processing a substrate according to an embodiment of the invention. Referring also to FIG. 2A, the method includes, in 100, providing a substrate 200 having an oxidized layer 202 formed thereon. The substrate 200 can contain silicon (Si), germanium (Ge), a compound semiconductor (e.g., gallium arsenide (GaAs) or indium gallium arsenide (InGaAs)), or a combination of two or more thereof. In some embodiments, the substrate can contain Si, SiGe, SiC, doped Si (e.g., boron, antimony, phosphorus, or arsenic doped), or doped Ge or SiGe (e.g., boron, antimony, phosphorus, or arsenic doped), or a combination of two or more thereof. The oxidized layer 202 may be a thermal oxide or an oxide layer formed on the substrate 200 by exposure to air or another oxidizing atmosphere. The oxidized layer 202 can contain an oxidized surface of the substrate, e.g., $SiO_x$, $SiGeO_x$, or $GeO_x$.

Figure 2B:
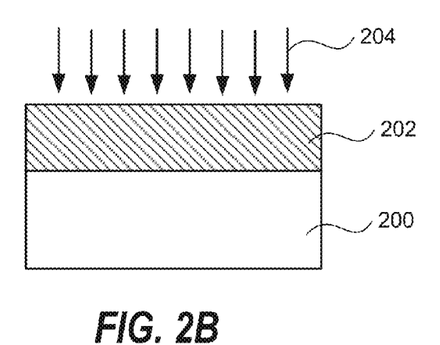
Figure 2C:
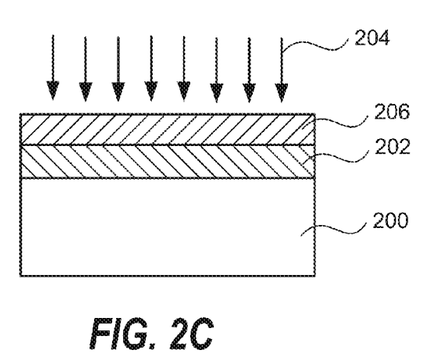
Figure 2D:
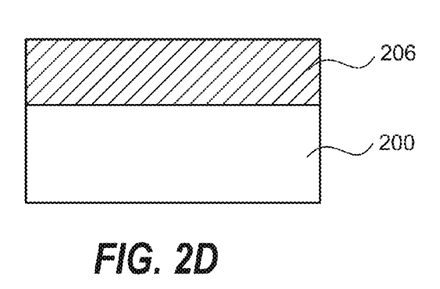

The method further includes, in 102, replacing the oxidized layer 202 with a fluorine-based layer 206. This is schematically illustrated in FIGS. 2B-2D. FIG. 2C shows partial replacement of the oxidized layer 202 with the fluorine-based layer 206. In one example, the oxidized layer 202 may be replaced with the fluorine-based layer 206 by exposing the oxidized layer 202 to a cleaning gas 204 containing a) $NH_3$ and HF, or b) $NF_3$ and HF, where the exposure to the cleaning gas 204 removes the oxidized layer 202 and passivates the substrate 200 with the fluorine-based layer 206.

According to one embodiment, replacing the oxidized layer 202 with the fluorine-based layer 206 includes removing the oxidized layer 202 from the substrate 200 and, thereafter, passivating the substrate 200 with the fluorine-based layer 206. Removing the oxidized layer 202 can include exposing the oxidized layer 202 to a cleaning gas 204 containing a) $NH_3$ and HF, or b) $NF_3$ and HF and, thereafter, heat-treating the substrate 200 to remove fluorine-based byproducts from the substrate 200. In the case of a Si substrate, the fluorine-based byproducts can include $(NH_4)_2SiF_6$. Following the heat-treating, a small amount of fluorine may be present on the substrate, however, this small amount of fluorine does not adequately protect the substrate against oxidation by an oxidizing atmosphere, and further passivation of the substrate by fluorine may be required. The passivation can include exposing the substrate 200 to a fluorine-containing plasma. The fluorine-containing plasma may be generated using a microwave plasma source by plasma exciting a fluorine-containing gas that is flowed into the vacuum processing tool or by plasma exciting gaseous fluorine-species that originate from the walls of the vacuum processing tool or from a low background gaseous fluorine species in the vacuum processing tool.

Figure 2E:
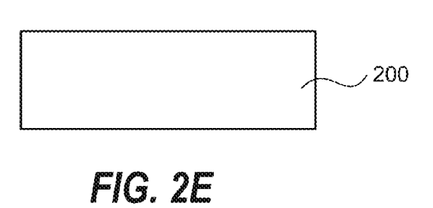

Once the substrate 200 containing the fluorine-based layer 206 is ready for further processing in the vacuum processing tool, the method further includes preparing a clean substrate 200 by removing the fluorine-based layer 206 from the substrate 200 using a plasma process. The plasma process can include exposing the fluorine-based layer to a plasma containing $H_2$, $N_2$, Ar, or $NH_3$, or a combination of two or more thereof. Thereafter, the clean substrate 200 depicted in FIG. 2E may be further processed under vacuum conditions. According to embodiments of the invention, the substrate can be maintained under vacuum conditions from a time before removing the fluorine-based layer 206 to a time after processing the clean substrate 200. This can include moving the clean substrate 200 under vacuum conditions between multiple vacuum processing tools or chambers.

Figure 2F:
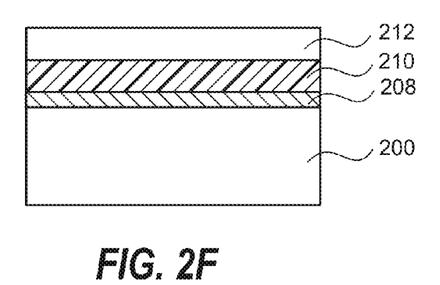

According to one embodiment, as depicted in FIG. 2F, the clean substrate 200 may be further processed by forming an oxygen-containing interface layer 208 on the substrate 200, and forming a high-k film 210 on the oxygen-containing interface layer 208. Thereafter, the substrate 200 may be exposed to air without detrimental effects. In some embodiments, a gate electrode layer 212 may be deposited on the high-k film 210. In one example, the oxygen-containing interface layer 208 may be formed by exposing the substrate 200 to an oxygen-containing plasma containing O, $O_3$, $H_2O$, or a combination thereof. The plasma may be generated using a microwave plasma source. Examples of high-k films include $HfO_2$, HfSiO, $ZrO_2$, ZrSiO, and rare earth oxides and silicates.

According to one embodiment, the method includes providing a Ge-containing substrate having an oxidized layer containing Ge and O formed thereon, removing the oxidized layer from the Ge-containing substrate by an exposure to a cleaning gas containing a) $NH_3$ and HF, or b) $NF_3$ and HF, where the exposure to the cleaning gas passivates the Ge-containing substrate with a fluorine-based layer. The method further includes exposing the fluorine-based layer to an oxidizing atmosphere, where the fluorine-based layer protects the substrate against oxidation by the oxidizing atmosphere. The method further includes removing the fluorine-based layer from the Ge-containing substrate using a plasma process, thereafter forming an oxygen-containing interface layer on the Ge-containing substrate, and depositing a high-k film on the oxygen-containing interface layer, where the Ge-containing substrate is maintained under vacuum conditions from a time before removing the fluorine-based layer to a time after depositing the high-k film.

According to another embodiment, the method includes providing a substrate having an oxidized layer formed thereon, where the substrate contains a compound semiconductor, replacing the oxidized layer with a fluorine-based layer, and exposing the fluorine-based layer to an oxidizing atmosphere, where the fluorine-based layer protects the substrate against oxidation by the oxidizing atmosphere. The method further includes removing the fluorine-based layer from the substrate using a plasma process, and thereafter forming an interface layer on the substrate by exposing the substrate to a plasma containing $H_2$, $N_2$, or an aluminum-containing gas, or a combination of two or more thereof. Thereafter, a high-k film may be deposited on the interface layer. In one example, the aluminum-containing gas can include trimethylaluminum (TMA). For example, the compound semiconductor can contain GaAs or InGaAs.

Figure 3:
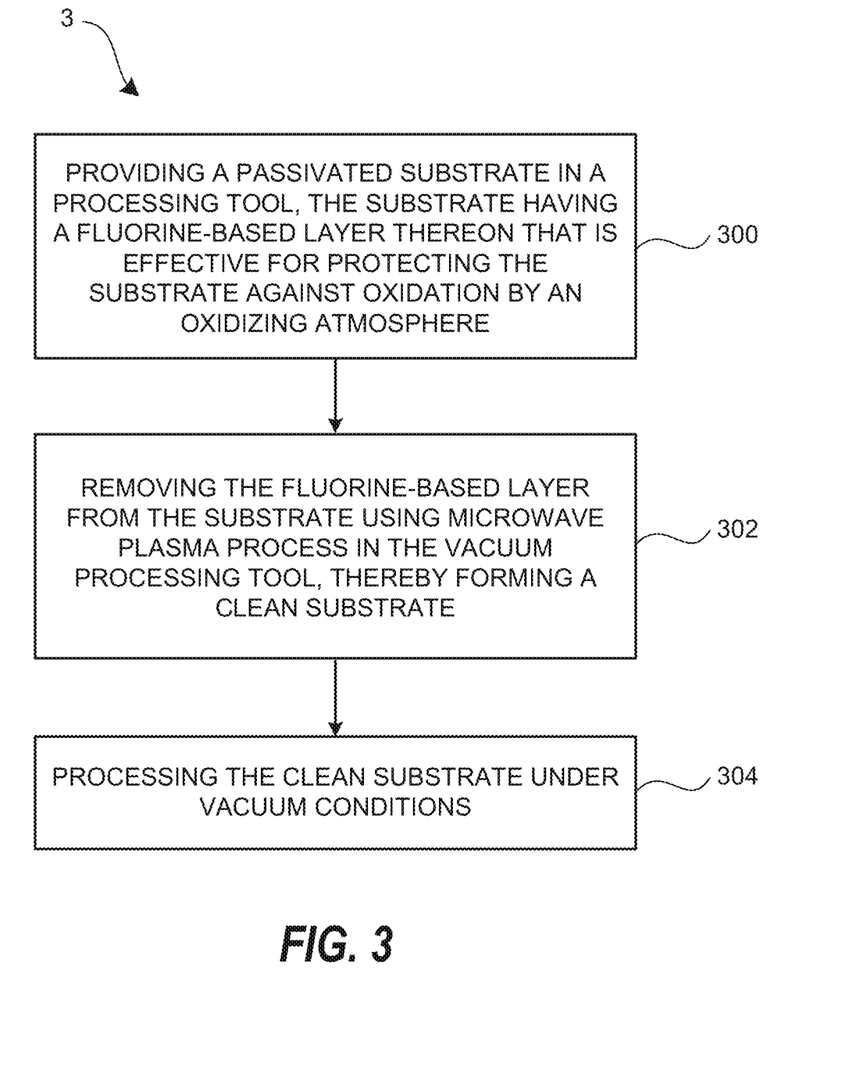
FIG. 3 is a process flow diagram for a method of processing a substrate according to another embodiment of the invention.

FIG. 3 is a process flow for forming a semiconductor device according to an embodiment of the invention. The method includes, in 300, providing a passivated substrate in a vacuum processing tool. The substrate can be passivated with a fluorine-based layer. The substrate can contain Si, Ge, a compound semiconductor (e.g., GaAs or InGaAs), or a combination of two or more thereof. In some embodiments, the substrate can contain Si, SiGe, SiC, doped Si (e.g., boron, antimony, phosphorus, or arsenic doped), or doped Ge (e.g., boron, antimony, phosphorus, or arsenic doped), or a combination of two or more thereof.

The fluorine-based layer is effective for protecting the substrate against oxidation by an oxidizing atmosphere. The presence of the fluorine-based layer on the substrate hinders and slows down normal oxidation of the substrate that would be observed in the absence of the fluorine-based layer. This means that the fluorine-based layer may be utilized to allow long queue times without the substrate becoming oxidized.

Thereafter, the method includes, in 302, removing the fluorine-based layer from the substrate using a microwave plasma process in the vacuum processing tool, thereby forming a clean substrate. The microwave plasma process can include exposing the fluorine-based layer to a plasma containing $H_2$, $N_2$, Ar, or $NH_3$, or a combination of two or more thereof. Thereafter, the method further includes, in 304, processing the clean substrate under vacuum conditions. According to embodiments of the invention, the substrate can be maintained under vacuum conditions from before removing the fluorine-based layer to after processing the clean substrate.

Figure 4A:
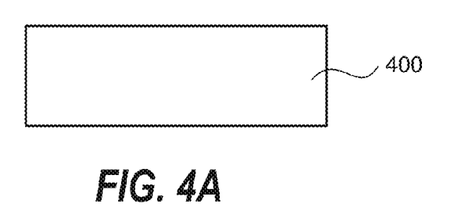
FIGS. 4A-4H schematically show cross-sectional views of a method of processing a substrate according to an embodiment of the invention.
Figure 4B:
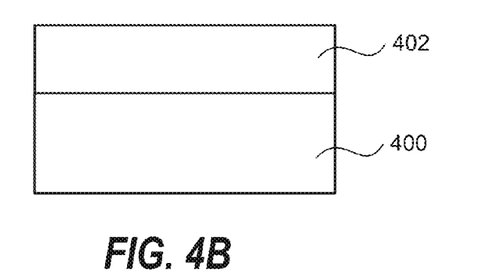
Figure 4C:
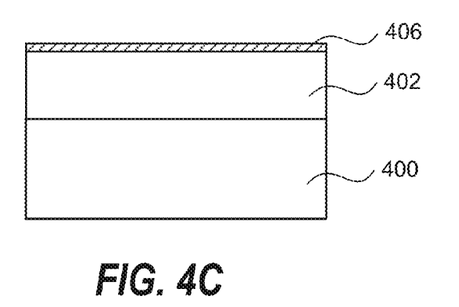
Figure 4D:
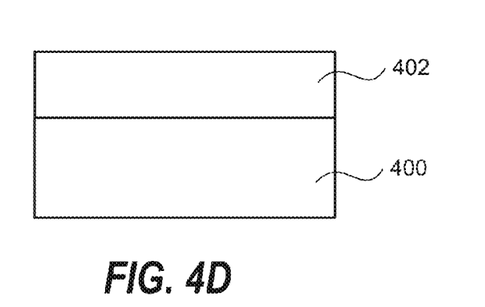

FIGS. 4A-4H schematically show cross-sectional views of a method of processing a substrate according to an embodiment of the invention. The embodiment depicted in FIGS. 4A-4H shows how a fluorine-based layer may be used in semiconductor manufacturing of a metal gate in a gate structure on a substrate to significantly increase queue time without the substrate becoming oxidized. FIG. 4A shows a substrate 400, and FIG. 4B shows a first metal gate layer 402 deposited on the substrate 400. In one example, the first metal gate layer 402 may include a TiN layer that is between 0.5-1 nm thick. Although not shown in FIG. 4B, an interface layer, a high-k layer, or both, may be present between the first metal gate layer 402 and the substrate 400. FIG. 4C shows a fluorine-based layer 406 that is formed on the first metal gate layer 402. The fluorine-based layer 406 may be formed as described above. The fluorine-based layer 406 protects the first metal gate layer 402 against oxidation, thereby allowing for a long queue time if needed. Thereafter, the fluorine-based layer 406 may be removed by a plasma process and FIG. 4D shows the resulting structure that contains a clean first metal gate layer 402. A plasma process for removing the fluorine-based layer is described above.

Figure 4E:
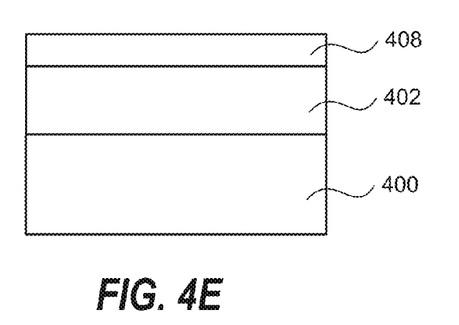

FIG. 4E shows a work function adjustment layer 408 that is deposited on the first metal gate layer 402. The work function adjustment layer 408 may include TiC, TiAlC, or a combination thereof, and can between 2 nm and 4 nm thick. According to another embodiment, the work function adjustment layer 408 may be omitted and instead the first metal gate layer 402 exposed to a microwave plasma containing $H_2$ or $O_2$, in order to adjust the workfunction of the first metal gate layer 402.

Figure 4F:
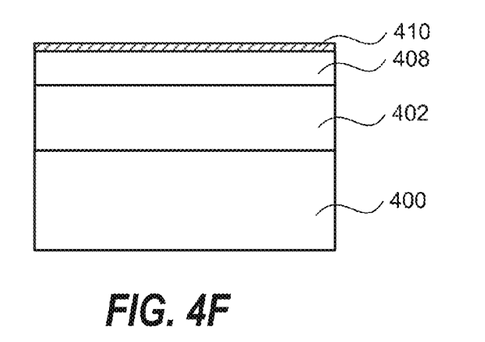
Figure 4G:
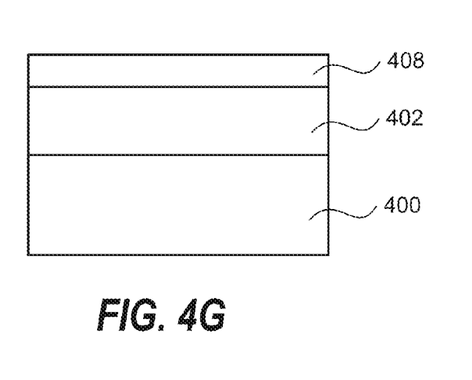
Figure 4H:
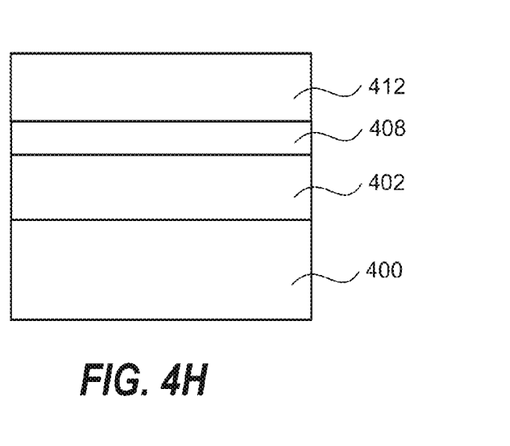

FIG. 4F shows a fluorine-based layer 410 that is formed on the work function adjustment layer 408. The fluorine-based layer 410 may be formed as described above. The fluorine-based layer 410 in FIG. 4F protects the work function adjustment layer 408 against oxidation and thereby allowing for a long queue time if needed. Thereafter, the fluorine-based layer 410 is removed by a plasma process and FIG. 4G shows the resulting structure. A plasma process for removing the fluorine-based layer 410 was described above. FIG. 4H shows a second metal gate layer 412 that may be deposited on the work function adjustment layer 408. In one example, the second metal gate layer 412 may include a TiN layer that is 3-4 nm thick.

Still referring to FIGS. 4A-4H, embodiments of the invention provide a method for providing clean surfaces where long queue times are often required. In the example described in FIGS. 4A-4H, fluorine-based layers 406 and 410 are utilized to protect the first metal gate layer 402 and the work function adjustment layer 408 from oxidation during possible long queue time. Those skilled in the art will readily realize that one or more fluorine-based layers may be utilized in semiconductor manufacturing that involves other layers than shown in FIGS. 4A-4H.

According to another embodiment, the substrate may contain Si, Ge, or a compound semiconductor, or a combination of two or more thereof, and may further contain a metal. In one example, the metal may be a metal contact in a recessed feature on the substrate. In this example, a fluorine-based layer may be formed on the metal contact and on other surfaces of the recessed feature in order to protect the metal contact and the other surfaces of the recessed feature against oxidation and thereby allowing for a long queue time if needed.

Figure 5:
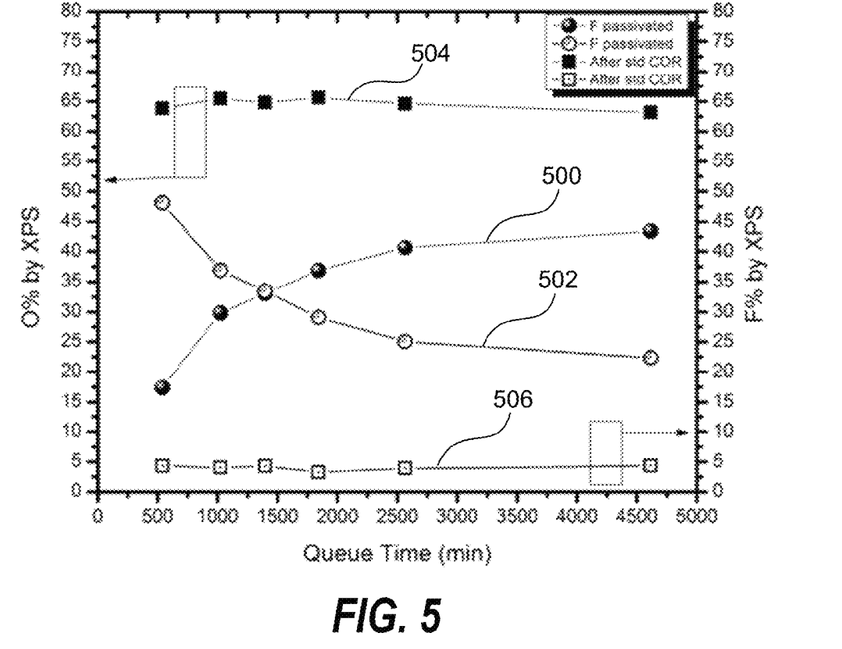
FIG. 5 shows O % and F % content of a fluorine-based layer on a Ge substrate as a function of queue time.

FIG. 5 shows O % and F % content of a fluorine-based layer on a Ge substrate as a function of queue time. The O % and F % contents were measured by X-ray photoelectron spectroscopy (XPS). The O % and F % contents were corrected for the different sensitivities of O, F, and Ge. A first Ge substrate was subjected to a standard chemical oxide removal (COR) process that removed an oxide layer from the first Ge substrate by exposure to HF and $NH_3$, followed by a heat-treatment. The first Ge substrate was then exposed to air. The resulting first Ge substrate contained a small amount of fluorine (~5%) as indicated by trace 506 and a large amount of oxygen as indicated by trace 504. FIG. 5 clearly shows that the small amount of fluorine did not effectively protect the first Ge substrate against oxidation as the O % was already saturated at ~65% after a queue time of only 500 min. A second Ge substrate was subjected to an exposure to HF and $NH_3$ but without a further heat-treatment, thereby forming a fluorine-based layer that protected the second Ge substrate against oxidation by the oxidizing atmosphere. The resulting second Ge substrate contained a large amount of fluorine (~50%) at a queue time of 500 min, as indicated by trace 502. As shown by the O % in trace 500, this large amount of fluorine was very effective for protecting the second Ge substrate against oxidation, thereby enabling long queue times.

Figure 6:
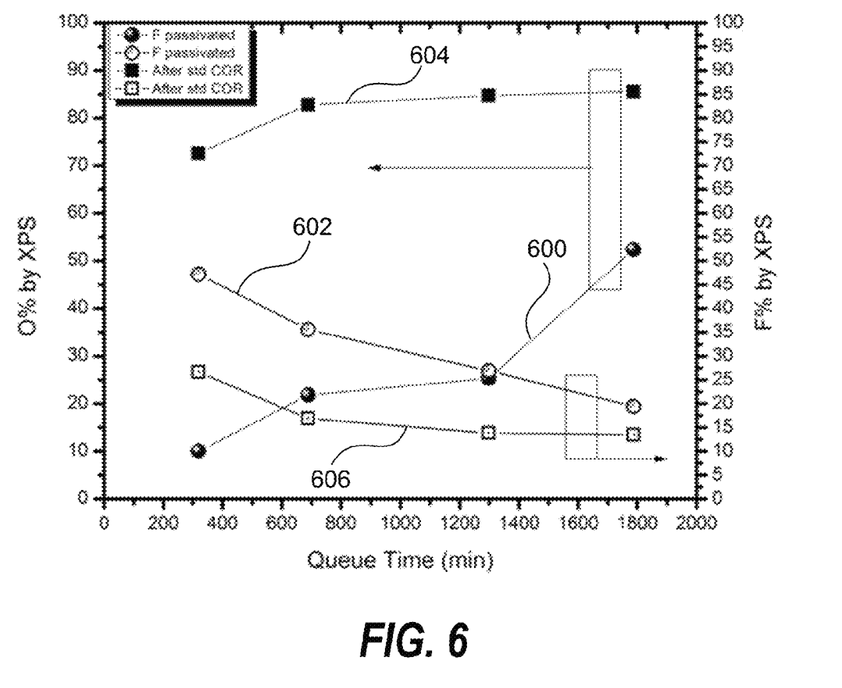
FIG. 6 shows O % and F % content of a fluorine-based layer on a Si substrate as a function of queue time.

FIG. 6 shows O % and F % content of a fluorine-based layer on a Si substrate as a function of queue time. A first Si substrate was subjected to a COR process that removed an oxide layer from the first Si substrate by exposure to HF and $NH_3$, followed by a heat-treatment. The first Si substrate was then exposed to air. The resulting first Si substrate contained a small amount of fluorine (~25%) as indicated by trace 606 and a large amount of oxygen as indicated by trace 604. FIG. 6 clearly shows that the small amount of fluorine did not effectively protect the first Si substrate against oxidation as the O % was above 70% after a queue time of only 300 min. A second Si substrate was subjected to an exposure to HF and $NH_3$ but without a further heat-treatment, thereby forming a fluorine-based layer that protected the second Si substrate against oxidation by the oxidizing atmosphere. The resulting second Si substrate contained a large amount of fluorine (~50%) at a queue time of 300 min, as indicated by trace 602. As shown by the O % in trace 600, this large amount of fluorine was very effective for protecting the second Si substrate against oxidation, thereby enabling long queue times.

Figure 7:
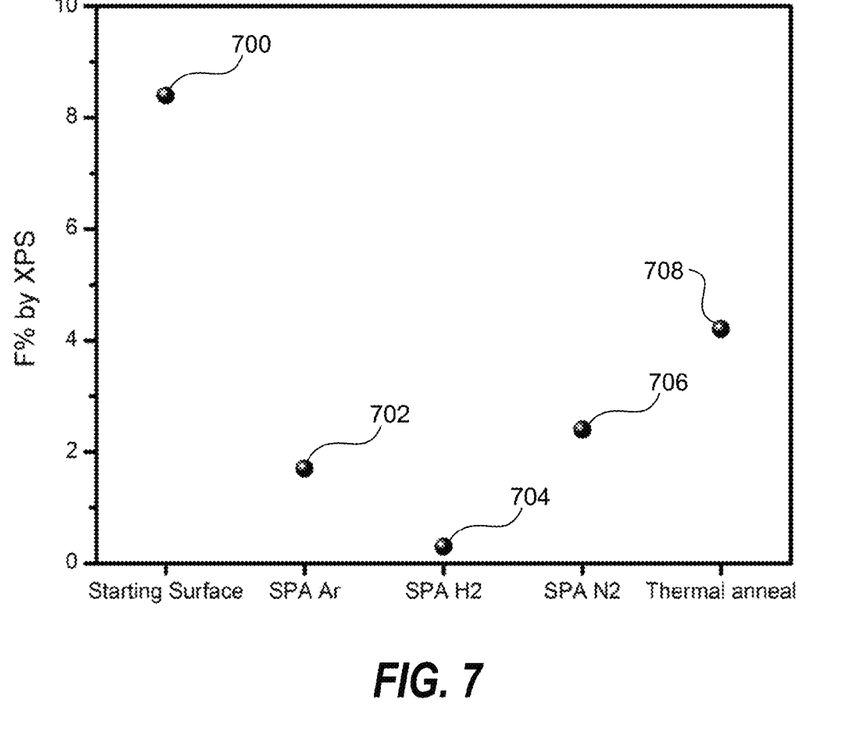
FIG. 7 shows F % content of a fluorine-based layer on a SiN substrate following different substrate treatments of the fluorine-based layer.

FIG. 7 shows F % content of a fluorine-based layer on a SiN substrate following different substrate treatments of the fluorine-based layer. The starting SiN substrates had a fluorine-based layer with F % of about 8.5% (label 700). The different substrate treatments included 1) Ar plasma (label 702), 2) $H_2$ plasma (label 704), 3) $N_2$ plasma (label 706), and 4) heat-treating (thermal anneal) at 700 deg. C (label 708). The substrate treatments in 1)-3) used a microwave plasma source to generate the plasma. The processing conditions for the substrate treatments and other processes in this disclosure are shown below in Table I. The results in FIG. 7 show that a microwave plasma treatment is more effective in fluorine removal than a thermal anneal, and in particular, a $H_2$ plasma treatment is very effective in fluorine removal from a substrate.

TABLE I

| Proc. Cond | Pressure | Plsm Pwr | Treat Time | Set Temp. | Ar | H2 | N2 | NH3 | O2 | HF |
| --- | --- | --- | --- | --- | --- | --- | --- | --- | --- | --- |
| SPA Ar | 90 mT | 2000 W | 120 sec | 250 C. | 1000 cc | — | — | — | — | — |
| SPA H2 | 90 mT | 2000 W | 120 sec | 250 C. | 1000 cc | 100 cc | — | — | — | — |
| SPA N2 | 90 mT | 2000 W | 120 sec | 250 C. | 1000 cc | — | 200 cc | — | — | — |
| SPA O2 | 90 mT | 2000 W | 120 sec | 250 C. | 1000 cc | — | — | — | 25 cc | — |
| Thermal Anneal | 1T | — | 300 sec | 808 C. | 100 cc | — | — | — | — | — |
| Std COR | 40 mT | — | 22 sec | 35 C. | 37 | — | — | 40 | — | 40 |
| std PHT | 675 mT | — | 120 sec | 175 C. | — | — | 900 | — | — | — |

In Table I, std COR refers to the HF and $NH_3$ exposures during COR, and std PHT refers to the subsequent heat-treating to remove the fluorine-containing byproducts from the substrate. SPA refers to plasma processing using a microwave plasma source.

Figure 8:
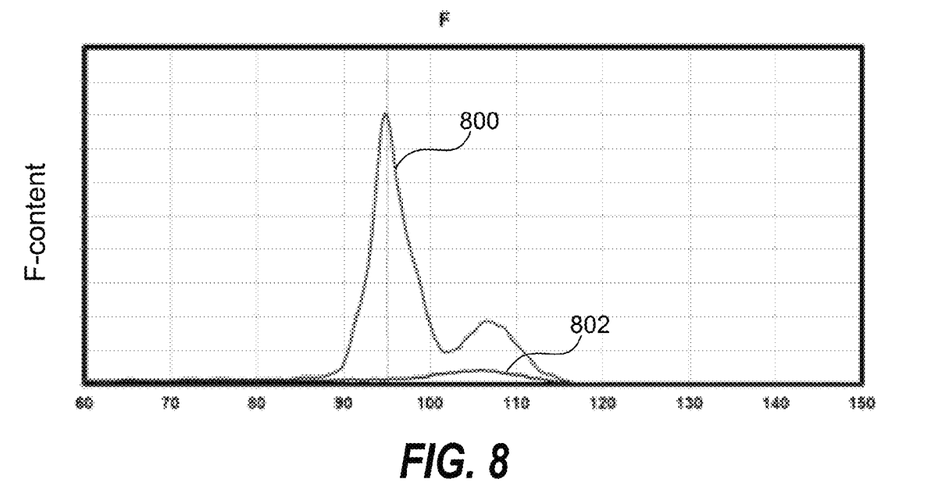
FIG. 8 shows relative F-content on a SiN substrate as measured by backside SIMS (secondary ion mass spectroscopy)

FIG. 8 shows relative fluorine-content on a SiN substrate as measured by backside SIMS (secondary ion mass spectroscopy). Trace 800 shows the relative fluorine-content for a fluorine-based layer on the SiN substrate, and trace 802 shows the relative fluorine-content after exposing the fluorine-based layer on the SiN substrate to a microwave plasma containing $H_2$ gas. FIG. 8 shows that a $H_2$ microwave plasma treatment is very effective in fluorine removal from a SiN substrate.

Exemplary Microwave Plasma Processing Systems

Figure 9:
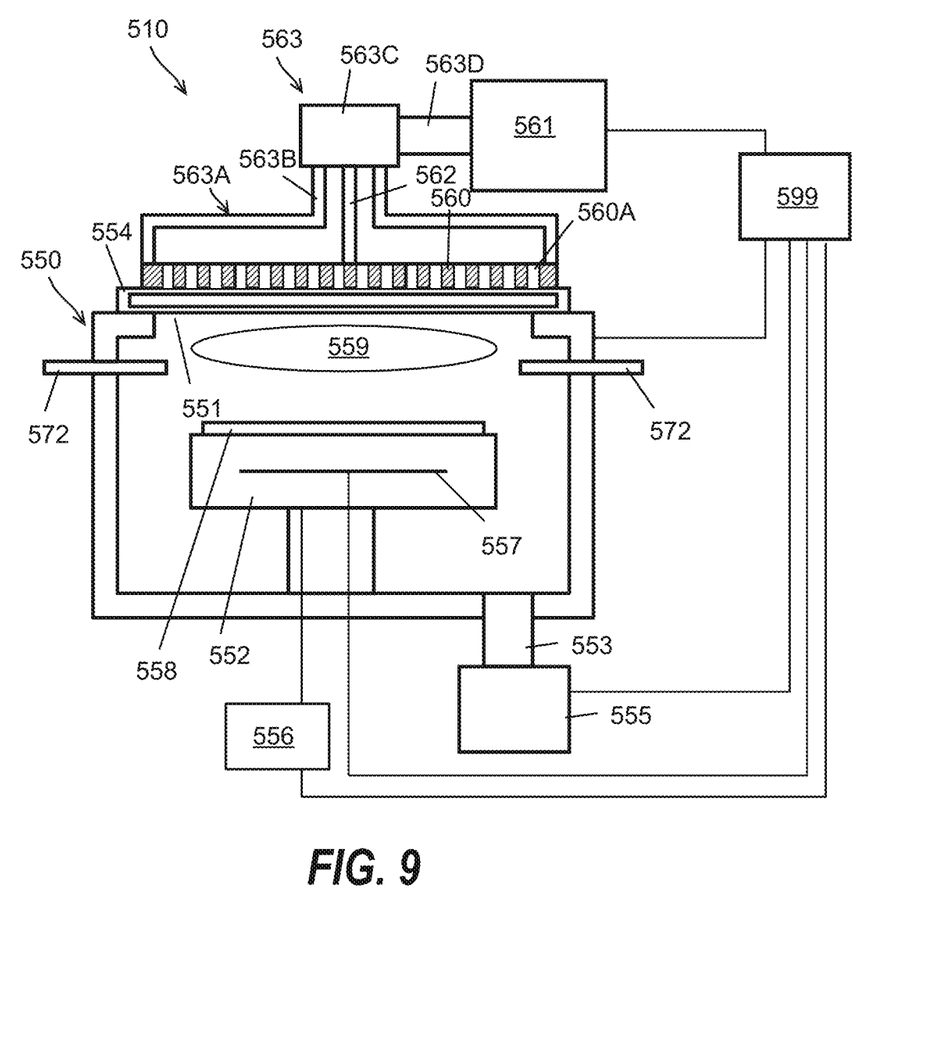
FIG. 9 is a schematic diagram of a plasma processing system containing a microwave plasma source for processing a substrate according to an embodiment of the invention.

FIG. 9 is a schematic diagram of a microwave plasma processing system containing a RLSA™ plasma for processing a substrate according to embodiments of the invention. The plasma produced in the plasma processing system 510 is characterized by low electron temperature and high plasma density. The plasma processing system 510 contains a plasma processing chamber 550 having an opening portion 551 in the upper portion of the plasma processing chamber 550 that is larger than a substrate 558. A cylindrical dielectric top plate 554 made of quartz, aluminum nitride, or aluminum oxide is provided to cover the opening portion 551.

Gas lines 572 are located in the side wall of the upper portion of plasma processing chamber 550 below the top plate 554. In one example, the number of gas lines 572 can be 16 (only two of which are shown in FIG. 9). Alternatively, a different number of gas lines 572 can be used. The gas lines 572 can be circumferentially arranged in the plasma processing chamber 550, but this is not required for the invention. A process gas can be evenly and uniformly supplied into the plasma region 559 in plasma processing chamber 550 from the gas lines 572.

In the plasma processing system 510, microwave power is provided to the plasma processing chamber 550 through the top plate 554 via a slot antenna 560 having a plurality of slots 560A. The slot antenna 560 faces the substrate 558 to be processed and the slot antenna 560 can be made from a metal plate, for example copper. In order to supply the microwave power to the slot antenna 560, a waveguide 563 is disposed on the top plate 554, where the waveguide 563 is connected to a microwave power supply 561 for generating microwaves with a frequency of about 2.45 GHz, for example. The waveguide 563 contains a flat circular waveguide 563A with a lower end connected to the slot antenna 560, a circular waveguide 563B connected to the upper surface side of the flat circular waveguide 563A, and a coaxial waveguide converter 563C connected to the upper surface side of the flat circular waveguide 563B. Furthermore, a rectangular waveguide 563D is connected to the side surface of the coaxial waveguide converter 563C and the microwave power supply 561.

Inside the circular waveguide 563B, an axial portion 562 of an electroconductive material is coaxially provided, so that one end of the axial portion 562 is connected to the central (or nearly central) portion of the upper surface of slot antenna 560, and the other end of the axial portion 562 is connected to the upper surface of the circular waveguide 563B, thereby forming a coaxial structure. As a result, the circular waveguide 563B is constituted so as to function as a coaxial waveguide. The microwave power can, for example, be between about 0.5 W/cm$^2$ and about 4 W/cm$^2$. Alternatively, the microwave power can be between about 0.5 W/cm$^2$ and about 3 W/cm$^2$. The microwave irradiation may contain a microwave frequency of about 300 MHz to about 10 GHz, for example about 2.45 GHz, and the plasma may contain an electron temperature of less than or equal to 5 eV, including 1, 1.5, 2, 2.5, 3, 3.5, 4, 4.5 or 5 eV, or any combination thereof. In other examples, the electron temperature can be below 5eV, below 4.5eV, below 4eV, or even below 3.5eV. In some examples, the electron temperature can be between 3.0 and 3.5 eV, between 3.5eV and 4.0eV, or between 4.0 and 4.5 eV. The plasma may have a density of about $1\times10^{11}/cm^3$ to about $1\times10^{13}/cm^3$, or higher.

In addition, in the plasma processing chamber 550, a substrate holder 552 is provided opposite the top plate 554 for supporting and heating a substrate 558 (e.g., a wafer). The substrate holder 552 contains a heater 557 to heat the substrate 525, where the heater 557 can be a resistive heater. Alternatively, the heater 557 may be a lamp heater or any other type of heater. Furthermore the plasma processing chamber 550 contains an exhaust line 553 connected to the bottom portion of the plasma processing chamber 550 and to a vacuum pump 555.

The plasma processing system 510 further contains a substrate bias system 556 configured to bias the substrate holder 552 and the substrate 558 for generating a plasma and/or controlling energy of ions that are drawn to a substrate 558. The substrate bias system 556 includes a substrate power source configured couple power to the substrate holder 552. The substrate power source contains a RF generator and an impedance match network. The substrate power source is configured to couple power to the substrate holder 552 by energizing an electrode in the substrate holder 552. A typical frequency for the RF bias can range from about 0.1 MHz to about 100 MHz, and can be 13.56 MHz. In some examples, the RF bias can be less than 1 MHz, for example less than 0.8 MHz, less than 0.6 MHz, less than 0.4 MHz, or even less than 0.2 MHz. In one example, the RF bias can be about 0.4 MHz. Alternatively, RF power is applied to the electrode at multiple frequencies. The substrate bias system 556 is configured for supplying RF bias power can be between 0W and 100W, between 100W and 200W, between 200W and 300W, between 300W and 400W, or between 400W and 500W. In some examples, the RF bias power can be less than 100W, less than 50W, or less than 25W, for example. RF bias systems for plasma processing are well known to those skilled in the art. Further, the substrate bias system 556 includes a DC voltage generator capable of supplying DC bias between −5 kV and +5 kV to the substrate holder 552.

The substrate bias system 556 is further configured to optionally provide pulsing of the RF bias power. The pulsing frequency can be greater than 1 Hz, for example 2 Hz, 4 Hz, 6 Hz, 8 Hz, 10 Hz, 20 Hz, 30 Hz, 50 Hz, or greater. It is noted that one skilled in the art will appreciate that the power levels of the substrate bias system 556 are related to the size of the substrate being processed. For example, a 300 mm Si wafer requires greater power consumption than a 200 mm wafer during processing.

Still referring to FIG. 9, a controller 599 is configured for controlling the plasma processing system 510. The controller 599 can include a microprocessor, a memory, and a digital I/O port capable of generating control voltages sufficient to communicate and activate inputs of the plasma processing system 510 as well as monitor outputs from the plasma processing system 510. Moreover, the controller 599 is coupled to and exchanges information with plasma processing chamber 550, the vacuum pump 555, the heater 557, the substrate bias system 556, and the microwave power supply 561. A program stored in the memory is utilized to control the aforementioned components of plasma processing system 510 according to a stored process recipe. One example of controller 599 is a UNIX-based workstation. Alternatively, the controller 599 can be implemented as a general-purpose computer, digital signal processing system, etc.

Figure 10:
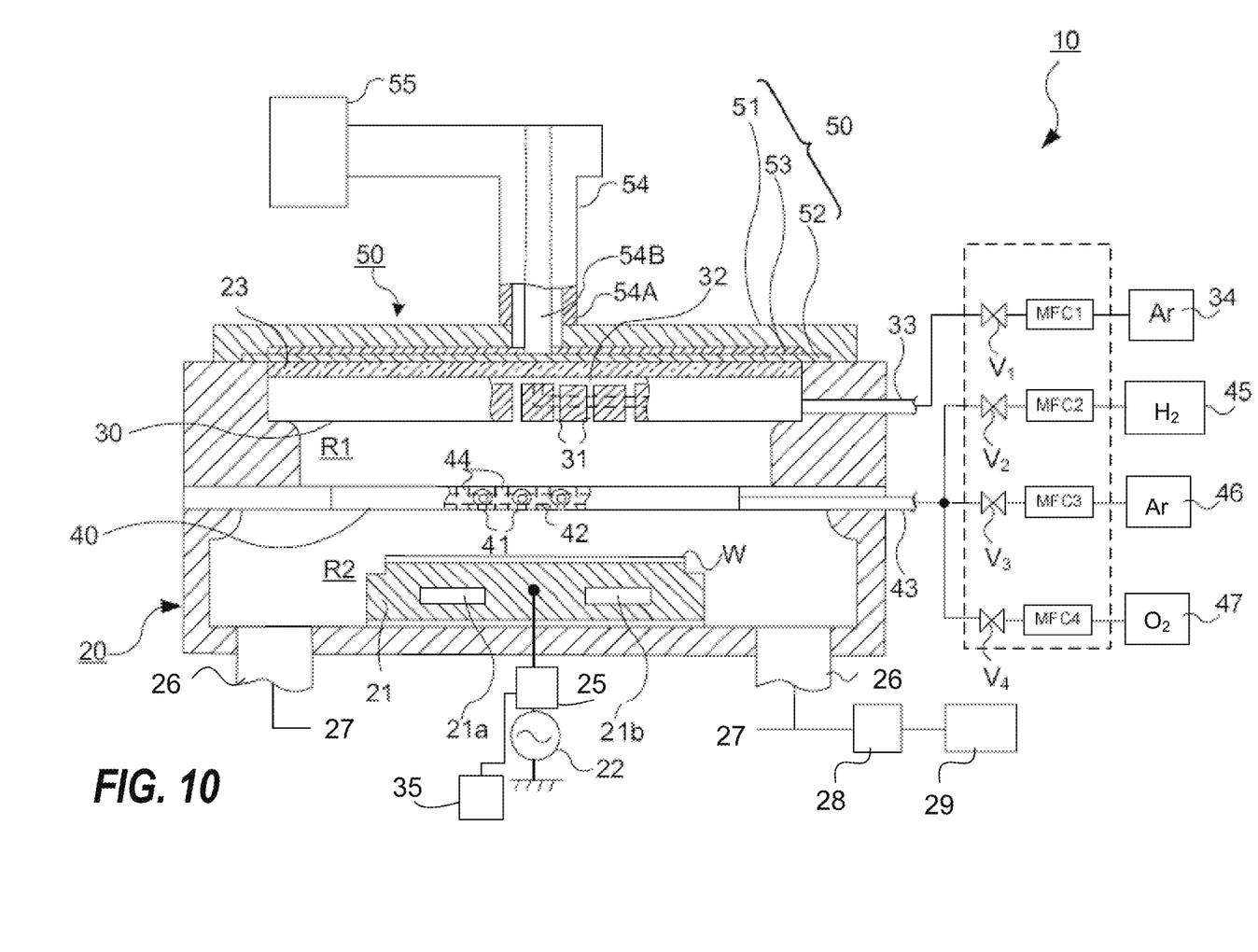
FIG. 10 is a schematic diagram of another plasma processing system containing a microwave plasma source for processing a substrate according to an embodiment of the invention.

FIG. 10 is a schematic diagram of a microwave plasma processing system containing a RLSA™ plasma for processing a substrate according to another embodiment of the invention. As shown in FIG. 10, the plasma processing system 10 includes a plasma processing chamber 20 (vacuum chamber), an antenna unit 50, and a substrate holder 21. Inside of the plasma processing chamber 20 is roughly sectionalized into a plasma generation region R1, located below a plasma gas supply unit 30, and a plasma diffusion region R2 above the substrate holder 21. A plasma generated in the plasma generation region R1 can have an electron temperature of several electron volts (eV). When the plasma is diffused into the plasma diffusion region R2, where the film formation process is performed, the electron temperature of the plasma near the substrate holder 21 may drop to a value of lower than about 2 eV. The substrate holder 21 is located centrally on a bottom portion of the plasma processing chamber 20 and serves as a substrate holder for supporting a substrate W. Inside the substrate holder 21, there is provided an insulating member 21a, a cooling jacket 21b, and a temperature control unit (not shown) for controlling the substrate temperature.

A top portion of the plasma processing chamber 20 is open-ended. The plasma gas supply unit 30 is placed opposite to the substrate holder 21 and is attached to the top portion of the plasma processing chamber 20 via sealing members such as O rings (not shown). The plasma gas supply unit 30, which may also function as a dielectric window, can be made of materials such as aluminum oxide or quartz and has a planar surface. A plurality of gas supply holes 31 are provided opposite the substrate holder 21 on a planar surface of the plasma gas supply unit 30. The plurality of gas supply holes 31 communicate with a plasma gas supply port 33 via a gas flow channel 32. A plasma gas supply source 34 provides a plasma gas, for example argon (Ar) gas, or other inert gases, into the plasma gas supply port 33. The plasma gas is then uniformly supplied into the plasma generation region R1 via the plurality of gas supply holes 31.

The plasma processing system 10 further includes a process gas supply unit 40, which is centered in the plasma processing chamber 20 between the plasma generation region R1 and the plasma diffusion region R2. The process gas supply unit 40 may be made of a conducting material, for example an aluminum alloy that includes magnesium (Mg), or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21.

The plasma processing chamber 20 further includes exhaust lines 26 connected to the bottom portion of the plasma processing chamber 20, a vacuum line 27 connecting the exhaust lines 26 to a pressure controller valve 28 and to a vacuum pump 29. The pressure controller valve 28 may be used to achieve a desired gas pressure in the plasma processing chamber 20.

Figure 11:
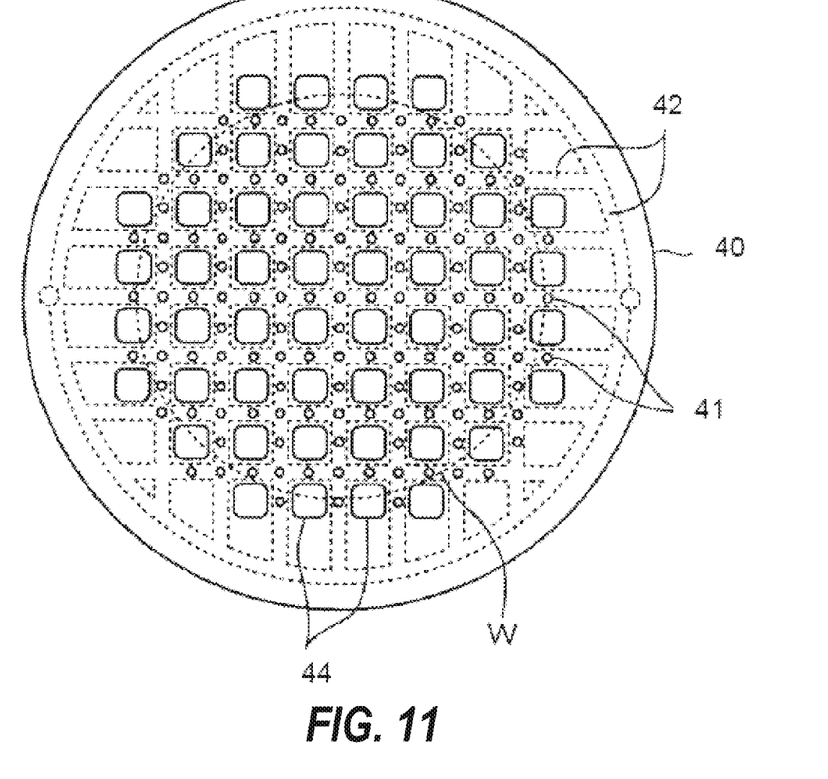
FIG. 11 illustrates a plan view of a gas supplying unit of the plasma processing system in FIG. 10.

A plan view of the process gas supply unit 40 is shown in FIG. 11. As shown in this figure, grid-like gas flow channels 42 are formed within the process gas supply unit 40. The grid-like gas flow channels 42 communicate with an upper-end of the plurality of gas supply holes 41, which are formed in the vertical direction. The lower portion of the plurality of gas supply holes 41 are openings facing the substrate holder 21. The plurality of gas supply holes 41 communicate with a process gas supply port 43 via the grid-patterned gas flow channels 42.

Further, a plurality of openings 44 are formed in the process gas supply unit 40 such that the plurality of openings 44 pass through the process gas supply unit 40 in the vertical direction. The plurality of openings 44 introduce the plasma gas, e.g., argon (Ar) gas, helium (He) gas, or other inert gases, into the plasma diffusion region R2 above the substrate holder 21. As shown in FIG. 11, the plurality of openings 44 are formed between adjacent gas flow channels 42. The process gas may be supplied from three separate process gas supply sources 45-47 to the process gas supply port 43. The process gas supply sources 45-47 may supply $H_2$ gas, $O_2$ gas, and Ar gas. However, other gases may be used.

The process gas flows through the grid-like gas flow channels 42 and is uniformly supplied into the plasma diffusion region R2 via the plurality of gas supply holes 41. The plasma processing system 10 further includes four valves (V1-V4) and four mass flow rate controller (MFC1-MFC4) for controlling a supply of the process gas.

An external microwave generator 55 provides a microwave of a predetermined frequency, e.g., 2.45 GHz, to the antenna unit 50 via a coaxial waveguide 54. The coaxial waveguide 54 may include an inner conductor 54B and an outer conductor 54A. The microwave from the microwave generator 55 generates an electric field just below the plasma gas supply unit 30 in the plasma generation region R1, which in turn causes excitation of the process gas within the plasma processing chamber 20.

Figure 12:
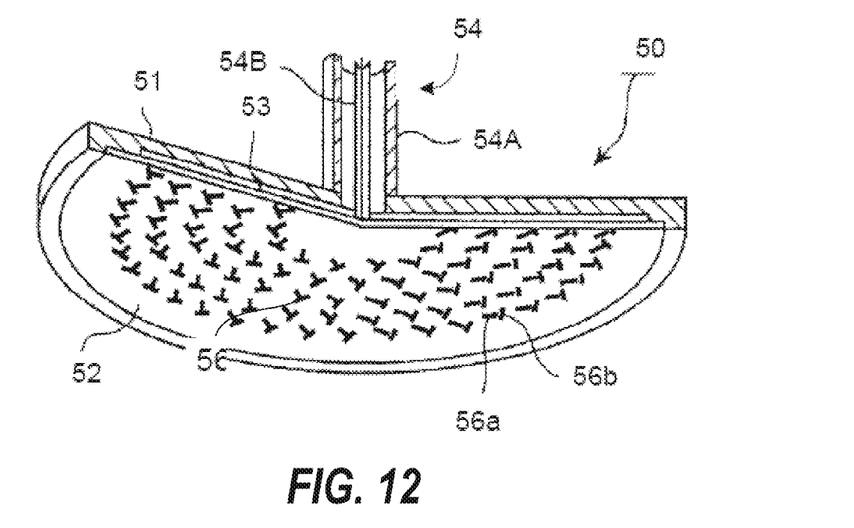
FIG. 12 illustrates a partial cross-sectional view of an antenna portion of the plasma processing system in FIG. 10.

FIG. 12 illustrates a partial cross-sectional view of the antenna unit 50. As shown in this figure, the antenna unit 50 may include a flat antenna main body 51, a radial line slot plate 52, and a dielectric plate 53 to shorten the wavelength of the microwave. The flat antenna main body 51 can have a circular shape with an open-ended bottom surface. The flat antenna main body 51 and the radial line slot plate 52 can be made of a conductive material.

A plurality of slots 56 are provided on the radial line slot plate 52 to generate a circularly polarized wave. The plurality of slots 56 are arranged in a substantially T-shaped form with a small gap between each slot. The plurality of slots 56 are arranged in a concentric circle pattern or a spiral pattern along a circumferential direction. Since the slots 56a and 56b are perpendicular to each other, a circularly polarized wave containing two orthogonal polarized components is radiated, as a plane wave, from the radial line slot plate 52.

The dielectric plate 53 can be made of a low loss dielectric material, e.g., aluminum oxide ($Al_2O_3$) or silicon nitride ($Si_3N_4$), that is located between the radial line slot plate 52 and the flat antenna main body 51. The radial line slot plate 52 may be mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling the energy of ions in the plasma that are drawn to the substrate W. The power supply source 22 is further configured to optionally provide pulsing of the RF bias power. The pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power between 0W and 100W, between 100 W and 200 W, between 200 W and 300 W, between 300 W and 400 W, or between 400 W and 500 W. One skilled in the art will appreciate that the power levels of the power supply source 22 are related to the size of the substrate being processed. For example, a 300 mm Si wafer requires greater power consumption than a 200 mm wafer during processing. The plasma processing system 10 further includes DC voltage generator 35 capable of supplying DC voltage bias between −5 kV and +5 kV to the substrate holder 21.

A plurality of embodiments for processing a substrate have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, the method comprising:
   providing a substrate having an oxidized layer formed thereon;
   replacing the oxidized layer with a fluorine-based layer;
   exposing the fluorine-based layer to an oxidizing atmosphere, wherein the fluorine-based layer protects the substrate against oxidation by the oxidizing atmosphere; and
   removing the fluorine-based layer from the substrate using a plasma process; wherein the substrate is maintained under vacuum conditions before removing the fluorine-based layer.

2. The method of claim 1, wherein the replacing comprises
   exposing the oxidized layer to a cleaning gas containing a) $NH_3$ and HF, or b) $NF_3$ and HF, wherein the exposing passivates the substrate with the fluorine-based layer.

3. The method of claim 1, wherein the replacing comprises
   removing the oxidized layer from the substrate; and
   thereafter, passivating the substrate with the fluorine-based layer.

4. The method of claim 3, wherein removing the oxidized layer comprises
   exposing the oxidized layer to a cleaning gas containing a) $NH_3$ and HF, or b) $NF_3$ and HF; and
   thereafter, heat-treating the substrate.

5. The method of claim 3, wherein the passivating comprises
   exposing the substrate to a fluorine-containing plasma.

6. The method of claim 5, wherein the fluorine-containing plasma is generated using a microwave plasma source.

7. The method of claim 1, wherein the oxidizing atmosphere contains air.

8. The method of claim 1, wherein the removing includes exposing the fluorine-based layer to a plasma containing $H_2$, $N_2$, Ar, or $NH_3$, or a combination of two or more thereof.

9. The method of claim 1, wherein the substrate contains Si, SiGe, Ge, or a compound semiconductor.

10. A substrate processing method, the method comprising:
    providing a substrate having an oxidized layer formed thereon;
    replacing the oxidized layer with a fluorine-based layer;
    exposing the fluorine-based layer to an oxidizing atmosphere, wherein the fluorine-based layer protects the substrate against oxidation by the oxidizing atmosphere;
    removing the fluorine-based layer from the substrate using a plasma process;
    following the removing, forming an oxygen-containing interface layer on the substrate; and
    depositing a high-k film on the oxygen-containing interface layer.

11. The method of claim 10, wherein forming an oxygen-containing interface layer on the substrate includes exposing the substrate to an oxygen-containing plasma containing O, $O_3$, $H_2O$, or a combination thereof.

12. The method of claim 11, wherein the oxygen-containing plasma is generated using a microwave plasma source.

13. The method of claim 12, wherein the substrate is maintained under vacuum conditions from before removing the fluorine-based layer to after depositing the high-k film.

14. A substrate processing method, the method comprising:
providing a Ge-containing substrate having an oxidized layer containing Ge formed thereon;
removing the oxidized layer from the Ge-containing substrate by an exposure to a cleaning gas containing a) $NH_3$ and HF, or b) $NF_3$ and HF, wherein the exposure to the cleaning gas further passivates the Ge-containing substrate with a fluorine-based layer;
exposing the fluorine-based layer to an oxidizing atmosphere, wherein the fluorine-based layer protects the Ge-containing substrate against oxidation by the oxidizing atmosphere;
removing the fluorine-based layer from the Ge-containing substrate using a microwave plasma process containing $H_2$ gas;
thereafter, forming an oxygen-containing interface layer on the Ge-containing substrate using a microwave plasma process; and
depositing a high-k film on the oxygen-containing interface layer, wherein the Ge-containing substrate is maintained under vacuum conditions from before removing the fluorine-based layer to after depositing the high-k film.

15. A substrate processing method, the method comprising:
providing a passivated substrate in a vacuum processing tool, the passivated substrate having a fluorine-based layer thereon that is effective for protecting the passivated substrate against oxidation by an oxidizing atmosphere;
removing the fluorine-based layer from the passivated substrate using a microwave plasma process in the vacuum processing tool, thereby forming a clean substrate; and
processing the clean substrate under vacuum conditions.

16. The method of claim 15, wherein the passivated substrate contains Si, SiGe, Ge, or a compound semiconductor.

17. The method of claim 15, wherein providing the passivated substrate includes
providing the substrate having an oxidized layer formed thereon; and
replacing the oxidized layer with the fluorine-based layer.

18. The method of claim 17, wherein the replacing comprises
exposing the oxidized layer to a cleaning gas containing a) $NH_3$ and HF, or b) $NF_3$ and HF, wherein the exposing removes the oxidized layer and passivates the substrate with the fluorine-based layer.

19. The method of claim 18, wherein the substrate is maintained under vacuum conditions from before removing the fluorine-based layer to after processing the clean substrate.

20. The method of claim 15, wherein the passivated substrate contains a recessed feature and a metal contact in the recessed feature.

21. The method of claim 15, wherein the processing comprises
following the removing, forming an oxygen-containing interface layer on the substrate; and
depositing a high-k film on the oxygen-containing interface layer.

* * * * *